(12) United States Patent
Perez et al.

(10) Patent No.: US 9,012,133 B2
(45) Date of Patent: Apr. 21, 2015

(54) REMOVAL OF ALKALINE CRYSTAL DEFECTS IN LITHOGRAPHIC PATTERNING

(75) Inventors: Javier J. Perez, Wappingers Falls, NY (US); Dario L. Goldfarb, Dobbs Ferry, NY (US); Ranee W. Kwong, Wappingers Falls, NY (US); Libor Vyklicky, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 192 days.

(21) Appl. No.: 13/221,248

(22) Filed: Aug. 30, 2011

(65) Prior Publication Data
US 2013/0052593 A1 Feb. 28, 2013

(51) Int. Cl.
*G03F 7/32* (2006.01)
*G03F 7/40* (2006.01)

(52) U.S. Cl.
CPC ..................................... *G03F 7/405* (2013.01)

(58) Field of Classification Search
CPC ....... G03F 7/405; G03F 7/425; H01L 21/312; H01L 21/3121
USPC ................................................. 430/329, 435
See application file for complete search history.

(56) References Cited

U.S. PATENT DOCUMENTS

| | | | |
|---|---|---|---|
| 3,549,368 A | 12/1970 | Collins et al. | |
| 4,332,881 A | 6/1982 | Shankoff | |
| 4,871,651 A * | 10/1989 | McCune et al. | 430/315 |
| 5,429,673 A | 7/1995 | Peterson et al. | |
| 5,702,767 A | 12/1997 | Peterson et al. | |
| 5,716,453 A | 2/1998 | Chen | |
| 6,372,408 B1 | 4/2002 | Lu et al. | |
| 6,420,101 B1 | 7/2002 | Lu et al. | |
| 6,617,095 B2 | 9/2003 | Kitano et al. | |
| 7,348,300 B2 | 3/2008 | Lassila et al. | |
| 7,465,529 B2 | 12/2008 | Takechi et al. | |
| 7,544,750 B2 | 6/2009 | Huang et al. | |
| 7,569,323 B2 | 8/2009 | Hatakeyama et al. | |
| 7,598,182 B2 | 10/2009 | Hatanaka et al. | |
| 7,700,262 B2 | 4/2010 | Li et al. | |
| 7,851,130 B2 | 12/2010 | Kawanishi et al. | |
| 7,883,828 B2 | 2/2011 | Allen et al. | |

| | | | |
|---|---|---|---|
| 2006/0160015 A1 * | 7/2006 | Takano et al. | 430/270.1 |
| 2009/0148789 A1 | 6/2009 | Amara et al. | |
| 2009/0246958 A1 | 10/2009 | Burns et al. | |

OTHER PUBLICATIONS

Endo, M. et al., "Application of a New Adhesion Promoter to Stable Chemically Amplified Resist Pattern Fabrication on Boron Phosphorus Silicate Glass Substrates" Japanese Journal of Applied Physics (Dec. 1997) pp. 7617-7619, vol. 36.

Ng, L. et al., "Defect Density Control on "Satellite Spots" or Chemical Stains for Deep-UV Resist Process" Proceedings of SPIE (Jul. 2002) pp. 679-689, vol. 4690.

Mukherjee-Roy, M. et al., "Effect of Developer Surfactant on Lithography Process Latitudes and Post Pattern Defect Concentration" Proceedings of SPIE (Jul. 2002) pp. 703-711, vol. 4690.

Mirth, G., "Reduction of Post Develop Residue Using Optimal Developer Chemistry & Develop/Rinse Processes" (Sep. 1995) Proceedings of SPIE pp. 268-272, vol. 2635.

Harumoto, M. et al., "Post-Develop Blob Defect Reduction" Proceedings of SPIE (Sep. 1, 2009) pp. 72730P-1-72730P-12, vol. 7273.

Nakano, K. et al., "Control and Reduction of Immersion Defectivity for Yield Enhancement at High Volume Production" Proceedings of SPIE (Mar. 16, 2009) pp. 72741P-1-72741P-9, vol. 7274.

Dai, C.M. et al., "Studies on the Adhesion Contact Angle of Various Substrates and Their Photoresist Profiles" Proceedings of SPIE (Jun. 1995) pp. 709-716, vol. 2438.

Dentinger, P.M. et al. , "The Importance of Chemistry at the Resist-Wafer Interface for Mechanical and Lithographic Adhesion" Proceedings of SPIE (May 1996) pp. 249-260, vol. 2723.

* cited by examiner

*Primary Examiner* — Daborah Chacko Davis

(74) *Attorney, Agent, or Firm* — Scully, Scott, Murphy & Presser, P.C.; Yuanmin Cai

(57) ABSTRACT

An adhesion promoter layer is formed on a surface of a substrate as an adhesion promoter layer, on which a photoresist is applied. The photoresist is lithographically exposed. Soluble portions of the lithographically exposed photoresist are dissolved in a developer solution including tetraalkylammonium hydroxide. Tetraalkylammonium hydroxide salts are formed in crystalline forms on surfaces of the substrate. A water-soluble acidic polymer layer is applied over the surfaces of the substrate to dissolve the tetraalkylammonium hydroxide salts. The water-soluble acidic polymer layer is rinsed off by water, thereby providing clean surfaces that do not include the tetraalkylammonium hydroxide salts on the substrate. Subsequent processes can be performed on the substrate, which is covered by remaining portions of the developed photoresist and has clean surfaces in regions not covered by the photoresist.

21 Claims, 4 Drawing Sheets

REMOVAL OF ALKALINE CRYSTAL DEFECTS IN LITHOGRAPHIC PATTERNING

BACKGROUND

The present disclosure relates to lithographic methods, and particularly to a method of removing crystalline salts on a substrate primed with a solvent that induces deposition of the crystalline salts.

Primer materials are commonly employed on a semiconductor substrate before spin coating to form an adhesion promoter for a photoresist. An adhesion promoter layer can be formed on the surface of a patterned or unpatterned substrate, which can be a semiconductor substrate, in many different ways. After formation of the adhesion layer, a photoresist is applied and planarized. The photoresist is subsequently lithographically exposed and developed to form a pattern on the substrate.

The thickness of the adhesion promoter formed by various methods known in the art depends on the method of deposition, and is affected by the composition of the underlying material. For example, it has been observed that an undoped silicon surface tends to cause the adhesion promoter to have a thickness of about one atomic monolayer of the adhesion promoter material, while a silicon surface doped with phosphorus tends to cause the adhesion promoter layer to have a thickness of several atomic monolayers of the adhesion promoter layer.

BRIEF SUMMARY

An adhesion promoter layer is formed on a surface of a substrate as an adhesion promoter layer, on which a photoresist is applied. The photoresist is lithographically exposed. Soluble portions of the lithographically exposed photoresist are dissolved in a developer solution including tetraalkylammonium hydroxide. Tetraalkylammonium hydroxide salts are formed in crystalline forms on surfaces of the substrate. A water-soluble acidic polymer layer is applied over the surfaces of the substrate to dissolve the tetraalkylammonium hydroxide salts. The water-soluble acidic polymer layer is rinsed off by water, thereby providing clean surfaces that do not include the tetraalkylammonium hydroxide salts on the substrate. Subsequent processes can be performed on the substrate, which is covered by remaining portions of the developed photoresist and has clean surfaces in regions not covered by the photoresist.

According to an aspect of the present disclosure, a method of removing alkaline particles during lithographic processing is provided. The method includes: forming an alkaline-moiety-including adhesion promoter layer on a surface of a substrate; forming a photoresist layer over the adhesion promoter layer; removing a portion of the photoresist layer with a solution including tetraalkylammonium hydroxide, wherein tetraalkylammonium hydroxide salt crystals are formed on the surface of the substrate; applying a water-soluble acidic polymer layer on the surface of the substrate, wherein the tetraalkylammonium hydroxide salt crystals are dissolved in the water-soluble acidic polymer layer; and rinsing off the water-soluble acidic polymer layer with a solvent, wherein the surface becomes free of the tetraalkylammonium hydroxide salt crystals.

DETAILED DESCRIPTION

Figure 1A:
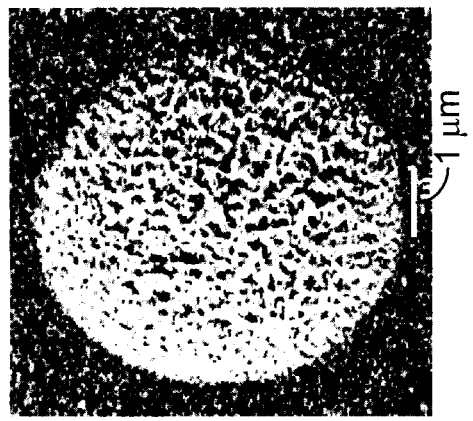
FIG. 1A is a dark field inspection image of a silicon surface after application of an alkaline-moiety-including adhesion promoter layer and a 193 nm photoresist layer, lithographic exposure, and removal of the photoresist layer with a developer solution including tetramethylammonium hydroxide immediately after removal of the photoresist layer.

As stated above, the present disclosure relates to a method of removing crystalline salts on a substrate primed with a solvent that induces deposition of the crystalline salts, which is now described in detail with accompanying figures. Throughout the drawings, the same reference numerals or letters are used to designate like or equivalent elements. The drawings are not necessarily drawn to scale.

As used herein, the visible range refers to the range of electromagnetic radiation of which the wavelength is between 400 nm to 800 nm.

As used herein, the ultraviolet range refers to the range of electromagnetic radiation of which the wavelength is between 10 nm to 400 nm.

As defined herein, the term "alkyl," alone or in combination with any other term, refers to a straight-chain or branch-chain saturated aliphatic hydrocarbon radical containing the specified number of carbon atoms, or where no number is specified, preferably from 1-16 and more preferably from 1-5 carbon atoms. Examples of alkyl radicals include, but are not limited to, methyl, ethyl, n-propyl, isopropyl, n-butyl, isobutyl, sec-butyl, tert-butyl, pentyl, isoamyl, n-hexyl and the like.

In the course of research leading to the present disclosure, it has been observed that some developed lithographic structures include crystalline defects in lithographically developed areas. Specifically, a surface of a substrate is first treated with an adhesion promoter. A photoresist is then applied to the adhesion promoter. The photoresist is subsequently lithographically exposed and developed. Defects, which acquire an increasing degree of crystallinity in time, are formed on surfaces of the substrate from which the photoresist is removed. For example, when a silicon substrate is primed with hexamethyldisilazane (HMDS) and coated with a 193 nm photoresist and subsequently lithographically exposed and developed, defects can be detected on an optical defect detection tool. Such defects are highly geometric in shape indicating crystalline nature.

Hexamethyldisilazane (HMDS) is an organosilicon compound with the molecular formula $[(CH_3)_3Si]_2NH$, and is also known as bis(trimethylsilyl)amine. The HMDS molecule is a derivative of ammonia in which trimethylsilyl groups replace two hydrogen atoms. HMDS is a colorless liquid, and also is a reagent and a precursor to bases frequently used in organic synthesis and organometallic chemistry.

Figure 1B:
FIG. 1B is a dark field inspection image of the silicon surface shown in FIG. 1A several hours after removal of the photoresist layer.
Figure 1C:
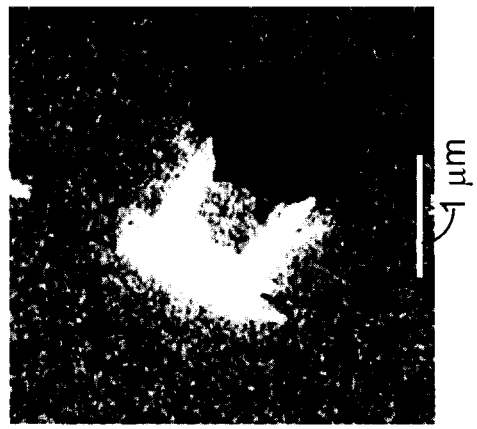
FIG. 1C is a dark field inspection image of the silicon surface shown in FIG. 1A after a few days after removal of the photoresist layer.

FIGS. 1A, 1B, and 1C show sequential dark field inspection images of a silicon surface on which HMDS and a 193 nm photoresist are sequentially applied, and which is lithographically exposed and developed so that the silicon surface is physically exposed. In FIG. 1A, a flat and smooth defect blob is observed immediately after removal of the lithographically exposed portion of the photoresist. In FIG. 1B, crystallites gradually grow at the expense of the initial defect blob in FIG. 1, thereby providing a silicon surface littered with growing crystals. Thus, the shape and the size of the crystalline defect is time dependent. In FIG. 1C, a fully grown crystalline defect is visible around the location at which the defect blob of FIG. 1A was previously present.

Analysis of the composition of the defects illustrated in FIGS. 1A-1C by X-ray diffraction and energy-dispersive X-ray spectroscopy (EDX) shows that the defects primarily include tetramethylammonium hydroxide, which is the material of the developer solution employed to develop the photoresist. Thus, interaction between tetramethylammonium hydroxide and HMDS causes the defects as residue during the development process.

The fact that the interaction between an adhesion promoter and a developer can cause formation of a hydroxide residue has been confirmed by various experiments performed in the course of research leading to the present disclosure. For example, absence of an alkaline-moiety-including adhesion promoter layer prevented formation of crystalline defects even with the use of a tetramethylammonium hydroxide including solvent as a developer in one experiment. Further, formation of an alkaline-moiety-including adhesion promoter layer followed by use of a tetramethylammonium hydroxide including solvent as a developer (without any application of a photoresist or lithographic exposure) formed crystalline defects on substrate in another experiment.

Figure 2:
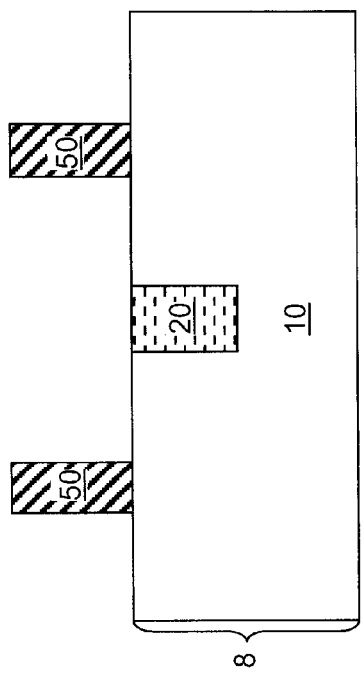
FIG. 2 is a vertical cross-sectional view of a first exemplary lithographic structure after formation of gate structures on a substrate according to a first embodiment of the present disclosure.

Referring to FIG. 2, a first exemplary lithographic structure according to a first embodiment of the present disclosure includes a substrate 8 and patterned structures 50 formed thereupon. The substrate 8 includes a semiconductor material portion 10 including a semiconductor material thereupon. In one embodiment, the substrate 8 can be a semiconductor-on-insulator (SOI) substrate and the semiconductor material portion 10 can be a top semiconductor layer in the SOI substrate. In another embodiment, the substrate 8 can be a bulk semiconductor substrate and the semiconductor material portion 10 can extend to the entirety of the bulk substrate.

The semiconductor material portion 10 includes a semiconductor material, which can be an elemental semiconductor material, an alloy of at least two elemental semiconductor materials, a III-V compound semiconductor material, a II-VI semiconductor material, or a stack thereof. The semiconductor material can be polycrystalline or single crystalline. In one embodiment, the semiconductor material portion 10 includes single crystalline silicon. The top surface of the semiconductor material portion 10 is a semiconductor surface, i.e., a surface having a semiconductor material. In one embodiment, an area of the top surface of the semiconductor material portion 10 can include a p-doped semiconductor material or an n-doped semiconductor material.

At least one shallow trench isolation structure 20 including a dielectric material can be formed in an upper portion of the semiconductor material portion 10. The at least one shallow trench isolation structure 20 includes a dielectric material such as silicon oxide, silicon nitride, and/or silicon oxynitride.

The patterned structures 50 can be any kind of structure that protrudes above the top surface of the semiconductor material portion 10. For example, the patterned structures 50 can be permanent gate stacks or can be disposable gate stacks including at least one disposable material portion. The permanent gate stacks can include, from bottom to top, a gate dielectric, a gate electrode, and optionally a gate cap dielectric. The at least one disposable material portions can include, for example, a disposable dielectric material portion and a disposable semiconductor material portion. Alternately, the patterned structures 50 can be any protruding structure that includes a dielectric material, a metallic material, a semiconductor material, or a combination thereof.

Figure 3:
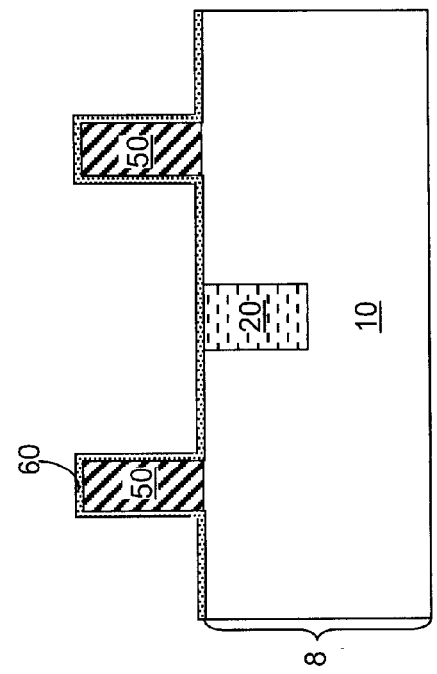
FIG. 3 is a vertical cross-sectional view of the first exemplary lithographic structure after formation of an alkaline-moiety-including adhesion promoter layer according to the first embodiment of the present disclosure.

Referring to FIG. 3, an adhesion promoter layer 60 is formed on exposed surfaces of the substrate 8 and the patterned structures 50. As used herein, an "adhesion promoter layer" is a layer of a material that has the property of promoting adhesion between a surface and a polymer material (such as a photoresist material). The exposed surfaces of the substrate 8 can include a top surface of the semiconductor material portion 10 and the at least one shallow trench isolation structure 20. The adhesion promoter layer 60 is formed as a single contiguous material layer that covers the entirety of exposed surface on the top side of the substrate 8, which includes all exposed surfaces of the patterned structures 50 and all exposed top surfaces of the substrate 8.

In one embodiment, the adhesion promoter layer 60 can be formed, for example, by vapor printing. The substrate 8 with the patterned structures 50 thereupon can be loaded into a vacuum chamber. The vacuum chamber is pumped to provide a vacuum environment therein, and is backfilled with the vapor of an adhesion promoter material. The vapor of the adhesion promoter material is adsorbed on the exposed surfaces of the substrate 8 and the patterned structures 50.

For example, the adhesion promoter material can be hexamethyldisilazane (HDMS). In this case, the temperature of the vacuum chamber may be maintained at room temperature, or elevated to a temperature not exceeding the boiling temperature of HMDS (126° C. at 1 atm) to facilitate adhesion of HMDS vapor to the exposed surfaces of the substrate 8 and the patterned structures 50.

In another embodiment, the adhesion promoter layer 60 can be formed by liquid printing. An adhesion promoter material is first dissolved in a solvent to provide a solution that contains an adhesion promoter material. For example, if HMDS is employed as the adhesion promoter material, propylene glycol methyl ether acetate (PGMEA) can be employed as the solvent for dissolving HMDS. The solution is applied to the substrate 8 with the patterned structures 50 and wet the exposed surfaces of the substrate 8 and the patterned structures 50. The solvent is allowed to evaporate, which leaves an alkaline-moiety-including adhesion promoter layer 60 on the surfaces of the substrate 8 and the patterned structures 50.

Additional materials that can be employed as the adhesion promoter material include, but are not limited to, triethylsilazane, tripropylsilazane, triphenylsilazane, N,N-diethyltriethylsilazane, hexaethyldisilazane, 1,1,3,3-tetramethyldisilizane, 1,1,3,3-tetraphenyl-1,3-dimethyldisilizane, 1,3,5,7-tetravinyl-1,3,5,7-tetramethylcyclotetrasilizane, 1,3,5-trivinyl-1,3,5-trimethylcyclotrisilizane, 1,3-bis(4-biphenyl)-1,1,3,3-tetramethyldisilizane, 1,3-bis(trifluoropropyl)-1,1,3,3-tetramethyldisilizane, 1,3-di-n-butyl-1,1,3,3-tetramethyldisilizane, 1,3-di-n-octyl-1,1,3,3-tetramethyldisilizane, 1,3-diphenyl-1,1,3,3-tetramethyldisilizane, 1,3-di-n-propyl-1,1,3,3-tetramethyldisilizane, 1,3-divinyl-1,3-diphenyl-1,3-dimethyldisilizane and 1,3-divinyl-1,1,3,3-tetramethyldisilizane In either embodiment, the thickness of the adhesion promoter layer 60 can be from 1 monolayer to 10 monolayers depending on the composition of the underlying surface, and is typically from 1 monolayer to 3 monolayers.

Figure 4:
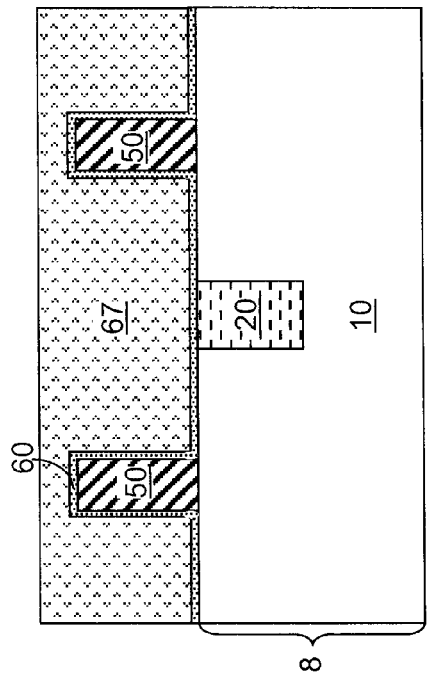
FIG. 4 is a vertical cross-sectional view of the first exemplary lithographic structure after formation of a photoresist layer according to the first embodiment of the present disclosure.

Referring to FIG. 4, a photoresist layer 67 is applied over the substrate 8 and the patterned structures 50, for example, by spin coating. In the first embodiment, the photoresist layer 67 includes a positive photoresist. A positive photoresist is a photoresist that is insoluble, in an as-applied state, to a developer solution, and becomes soluble in the developer solution upon exposure to light or electron beam. The wavelength of light that renders the positive photoresist soluble in the developer solution can be ultraviolet radiation. Thus, the photoresist layer 67 can include a positive photoresist for 248 nm lithography, a positive photoresist for 193 nm lithography, or a positive photoresist for electron beam lithography. Specifically, the photoresist layer 67 includes a positive photoresist that can be developed by a solution including tetraalkylammonium hydroxide.

Figure 5:
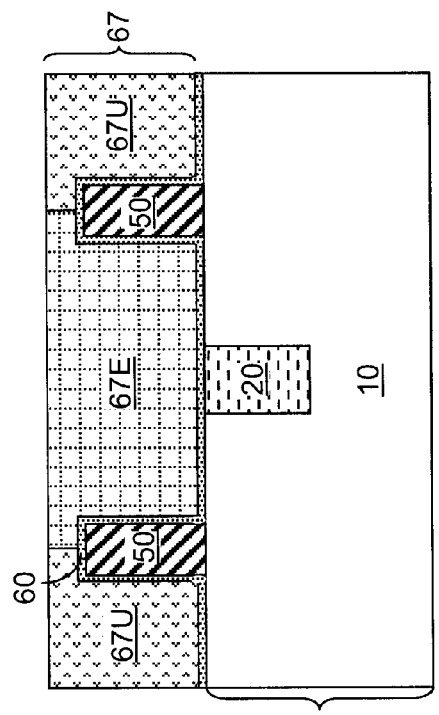
FIG. 5 is a vertical cross-sectional view of the first exemplary lithographic structure after lithographic exposure according to the first embodiment of the present disclosure.

Referring to FIG. 5, the photoresist layer 67 is lithographically exposed with a pattern by ultraviolet radiation or electron beam. The region of the photoresist layer 67 that is irradiated with ultraviolet radiation or electron beam becomes an exposed photoresist portion 67E, which is the illuminated portion of the photoresist layer 67 during the lithographical exposure. In the exposed photoresist portion 67E, the polymers of the photoresist material are chemically changed to become soluble in tetraalkylammonium hydroxide. The region of the photoresist layer 67 that is not irradiated with ultraviolet radiation or electron beam, which is herein referred to as an unexposed photoresist portion 67U, has the same composition as the photoresist material of the photoresist layer 67 as originally applied at the processing step of FIG. 4. Thus, the unexposed photoresist portion 67U is not soluble in tetraalkylammonium hydroxide.

Figure 6:
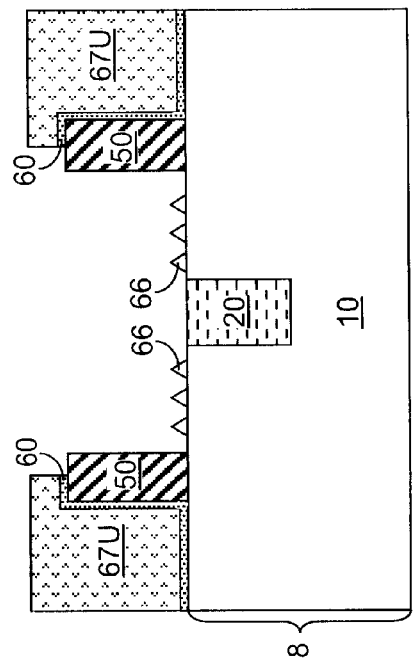
FIG. 6 is a vertical cross-sectional view of the first exemplary lithographic structure after development of the photoresist layer according to the first embodiment of the present disclosure.

Referring to FIG. 6, the photoresist layer 67 is developed employing a developer solution including tetraalkylammonium hydroxide. The developer solution can include tetraalkylammonium hydroxide and water. The exposed photoresist portion 67E is dissolved in the developer solution and is subsequently removed from the substrate 8, while the unexposed photoresist portion 67U remains on the substrate 8.

The tetraalkylammonium hydroxide can be selected from, but is not limited to, tetramethylammonium hydroxide, tetraethylammonium hydroxide, tetrabutylammonium hydroxide, tetrahexylammonium hydroxide, tetraoctylammonium hydroxide, tetradecylammonium hydroxide, tetradodecylammonium hydroxide, and hexadecyltrimethylammonium hydroxide. In general, tetraalkylammonium hydroxide is a strong organo-alkali, corrosive liquid.

The adhesion promoter layer 60 is physically exposed to the developer solution as the exposed photoresist portion 67E is removed selective to the unexposed photoresist portion 67U. The physically exposed portions of the adhesion promoter layer 60 can interact with the tetraalkylammonium hydroxide in the developer solution to form tetraalkylammonium hydroxide salt crystals 66. Particularly, tetraalkylammonium hydroxide salt crystals 66 can be formed on physically exposed semiconductor surfaces of the semiconductor material portion 10 in the substrate 8. The tetraalkylammonium hydroxide salt crystals 66 include crystals of salt of the tetraalkylammonium hydroxide in the developer solution. Thus, the tetraalkylammonium hydroxide salt crystals 66 can be, but are not limited to, tetramethylammonium hydroxide salt crystals, tetraethylammonium hydroxide salt crystals, tetrabutylammonium hydroxide salt crystals, tetrahexylammonium hydroxide salt crystals, tetraoctylammonium hydroxide salt crystals, tetradecylammonium hydroxide salt crystals, tetradodecylammonium hydroxide salt crystals, and hexadecyltrimethyammonium hydroxide salt crystals. The tetraalkylammonium hydroxide salt crystals 66 have a composition that includes primarily tetraalkylammonium hydroxide salt, and typically more than 90% in weight of tetraalkylammonium hydroxide salt.

Figure 7:
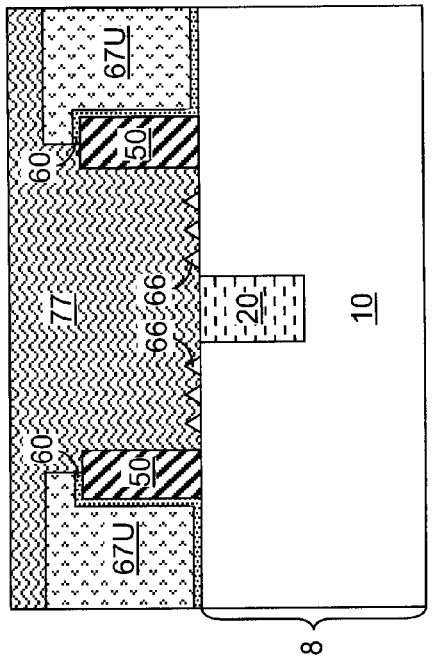
FIG. 7 is a vertical cross-sectional view of the first exemplary lithographic structure after formation of a water-soluble acidic polymer layer according to the first embodiment of the present disclosure.

Referring to FIG. 7, a water-soluble acidic polymer layer 77 is applied to the surface of the substrate 8 including the tetraalkylammonium hydroxide salt crystals 66. The water-soluble acidic polymer layer 77 includes an acidic polymer material that dissolves the tetraalkylammonium hydroxide salt crystals 66. An acidic polymer material herein refers to a polymer material having a pH less than 7 in aqueous solution. The water-soluble acidic polymer material can include, but is not limited to, poly(acrylic acid), poly(methacrylic acid), poly(2-ethylacrylic acid), poly(2-propylacrylic acid), poly(maleic acid), poly(exo,exo-5-norbornene-2,3-dicarboxylic acid), poly(vinylsulfonic acid), poly(4-styrenesulfonic acid), poly(2-acrylamido-2-methyl-1-propane sulfonic acid) and poly(vinylphosphonic acid). The water-soluble acidic polymer material can also include the polymeric moieties formerly described, copolymerized with non-acidic or weakly acidic groups, such as poly(methyl methacrylic acid-co-methacrylate), poly(methacrylic acid-co-styrene), poly(methacrylic acid-co-4-hydroxystyrene), poly(methacrylic acid-co-styrenehexafluoroalcohol) poly(1-vinylpyrrolidone-co-acrylic acid), poly(hydroxyethylmethacrylate-co-acrylic acid), poly(ethylene-co-acrylic acid), poly(methyl vinyl ether-alt-maleic acid) and poly(ethylene-alt-maleic acid).

In one embodiment, the water-soluble acidic polymer in the water-soluble acidic polymer layer 77 includes an acidic group selected from a carboxylic group, a phosphonic group, a hexafluoroalcohol group, a sulfonic group, a sulfinic acid group and a phenolic group.

In one embodiment, the water-soluble acidic polymer is not sensitive to radiation in visible range and ultraviolet range. For example, molecules of the water-soluble acidic polymer can have a composition that does not include a cross-linkable bond therein. It is noted that bottom antireflective coating (BARC) materials include cross-linkable bonds therein. Thus, the composition of the water-soluble acidic polymer is different from the composition of BARC materials as known in the art.

In one embodiment, the water-soluble acidic polymer can have an extinction coefficient less than 0.002 within visible range and ultraviolet range. It is noted that BARC materials known in the art have an extinction coefficient on the order of 0.4, which is more than two orders of magnitude than 0.002. Thus, BARC material as known in the art is not suitable for the water soluble acidic polymer due to excessively high extinction coefficients.

In one embodiment, the water-soluble acidic polymer is soluble in alcohol. It is noted that 193 nm photoresists are not soluble in alcohol, and 248 nm photoresists are typically soluble in alcohol.

In one embodiment, the water-soluble acidic polymer has a pH range from 2.0 to 6.0. In another embodiment, the water-soluble acidic polymer has a pH range from 3.0 to 5.0.

The molecules of the water-soluble acidic polymer have molecular weights within a range from 1,000 to 20,000.

The water-soluble acidic polymer layer 77 can be applied, for example, by spin coating. The thickness of the water-soluble acidic polymer layer 77 can be greater than, equal to, or less than the thickness of the remaining portion of the photoresist layer 67, i.e., the unexposed photoresist portion 67U.

Figure 8:
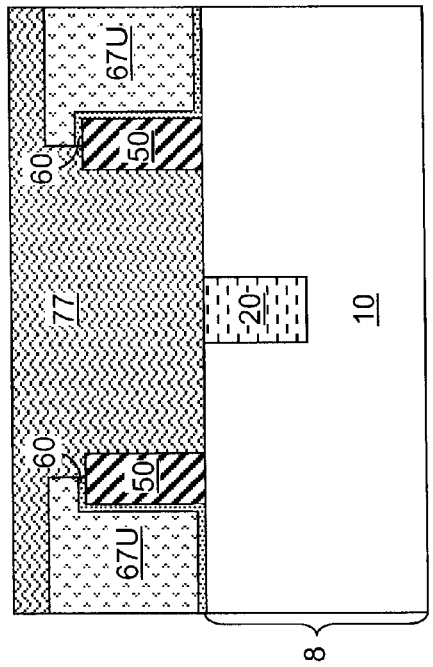
FIG. 8 is a vertical cross-sectional view of the first exemplary lithographic structure after the crystalline defects are dissolved in the water-soluble acidic polymer layer according to the first embodiment of the present disclosure.

Referring to FIG. 8, the tetraalkylammonium hydroxide salt crystals 66 are dissolved in the water-soluble acidic polymer layer 77. The tetraalkylammonium hydroxide salt crystals 66, as an alkaline material, react with the water-soluble acidic polymer, which is an acidic material, and are dissolved within the water-soluble acidic polymer layer 77.

In order to ensure that the tetraalkylammonium hydroxide salt crystals 66 are dissolved in the water-soluble acidic polymer layer 77, the processing step may include a waiting step after application of the water-soluble acidic polymer layer 77 at the processing step of FIG. 7 and a rinsing step to be subsequently performed. The waiting step lasts for a time period between the applying of the water-soluble acidic polymer layer 77 and the subsequent rinsing off of the water-soluble acidic polymer layer 77.

In one embodiment, the time period for waiting can be from 1 minute to 24 hours. The waiting step can be performed at a temperature selected from a range from 0 degree Celsius to 150 degree Celsius.

Figure 9:
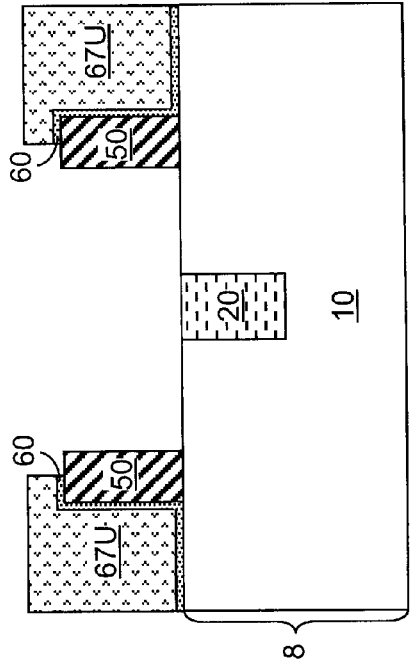
FIG. 9 is a vertical cross-sectional view of the first exemplary lithographic structure after rinsing of the water-soluble acidic polymer layer according to the first embodiment of the present disclosure.

Referring to FIG. 9, the water-soluble acidic polymer layer 77 is rinsed off with a solvent. The solvent can be water or a water-based solution. In one embodiment, the solvent can be deionized water.

Because the tetraalkylammonium hydroxide salt crystals 66 are dissolved in the water-soluble acidic polymer layer 77 at this point, the exposed surface of the substrate 8 is free of the tetraalkylammonium hydroxide salt crystals 66 after rinsing off the water-soluble acidic polymer layer 77 with the solvent.

Ion implantation or any other semiconductor processing steps compatible with the presence of the unexposed photoresist portion 67U on the substrate 8 can be performed at this point. The unexposed photoresist portion 67U can be subsequently removed, for example, by ashing. The processing steps of FIGS. 3-9 may be repeated multiple times as needed.

Figure 10:
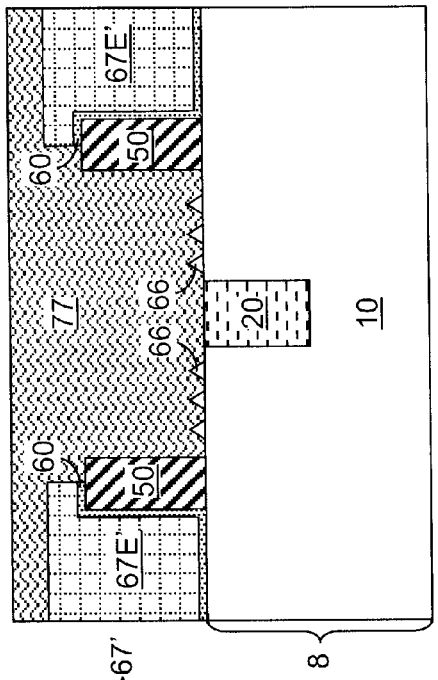
FIG. 10 is a vertical cross-sectional view of a second exemplary lithographic structure after lithographic exposure according to a second embodiment of the present disclosure.
Figure 12:
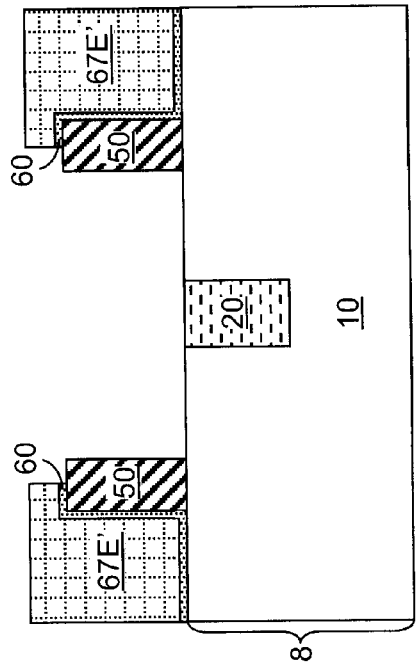
FIG. 12 is a vertical cross-sectional view of the second exemplary lithographic structure after formation of a water-soluble acidic polymer layer according to the first embodiment of the present disclosure.

Referring to FIG. 10, a second exemplary structure according to a second embodiment of the present disclosure can be derived from the first exemplary structure of FIG. 3 by applying a photoresist layer 67' that includes a negative photoresist. A negative photoresist is a photoresist that is soluble, in an as-applied state, to a developer solution, and becomes insoluble in the developer solution upon exposure to light or electron beam. The wavelength of light that renders the positive photoresist insoluble in the developer solution can be ultraviolet radiation. Thus, the photoresist layer 67' can include a negative photoresist for 248 nm lithography, a negative photoresist for 193 nm lithography, or a negative photoresist for electron beam lithography. Specifically, the photoresist layer 67' includes a negative photoresist that can be developed by a solution including tetraalkylammonium hydroxide.

The photoresist layer 67' is lithographically exposed with a pattern by ultraviolet radiation or electron beam. The region of the photoresist layer 67' that is irradiated with ultraviolet radiation or electron beam becomes an exposed photoresist portion 67E', which is the illuminated portion of the photoresist layer 67' during the lithographical exposure. In the exposed photoresist portion 67E', the polymers of the photoresist material are chemically changed to become insoluble in tetraalkylammonium hydroxide. The region of the photoresist layer 67' that is not irradiated with ultraviolet radiation or electron beam, which is herein referred to as an unexposed photoresist portion 67U', has the same composition as the photoresist material of the photoresist layer 67' as originally applied. Thus, the unexposed photoresist portion 67U' is soluble in tetraalkylammonium hydroxide.

Figure 11:
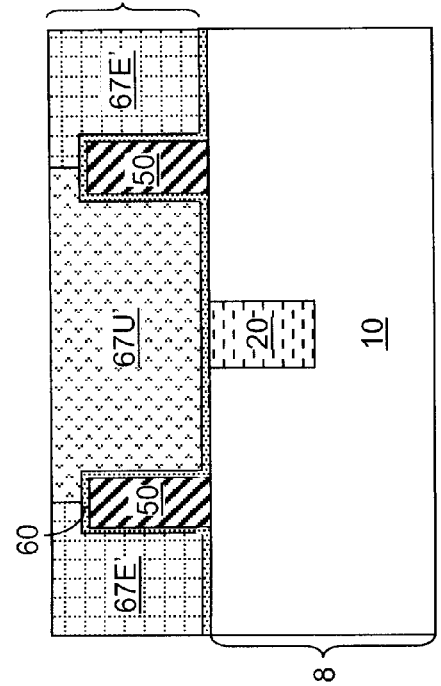
FIG. 11 is a vertical cross-sectional view of the second exemplary lithographic structure after development of the photoresist layer according to the first embodiment of the present disclosure.

Referring to FIG. 11, the photoresist layer 67' is developed employing a developer solution including tetraalkylammonium hydroxide. The developer solution can include tetraalkylammonium hydroxide and water. The unexposed photoresist portion 67U' is dissolved in the developer solution and is subsequently removed from the substrate 8, while the exposed photoresist portion 67E' remains on the substrate 8.

The tetraalkylammonium hydroxide can be the same as in the first embodiment. The adhesion promoter layer 60 is physically exposed to the developer solution as the unexposed photoresist portion 67U' is removed selective to the exposed photoresist portion 67E'. The physically exposed portions of the adhesion promoter layer 60 can interact with the tetraalkylammonium hydroxide in the developer solution to form tetraalkylammonium hydroxide salt crystals 66. Particularly, tetraalkylammonium hydroxide salt crystals 66 can be formed on physically exposed semiconductor surfaces of the semiconductor material portion 10 in the substrate 8. The tetraalkylammonium hydroxide salt crystals 66 include crystals of salt of the tetraalkylammonium hydroxide in the developer solution. The tetraalkylammonium hydroxide salt crystals 66 have a composition that includes primarily tetraalkylammonium hydroxide salt, and typically more than 90% in weight of tetraalkylammonium hydroxide salt.

Referring to FIG. 11, a water-soluble acidic polymer layer 77 is applied to the surface of the substrate 8 including the tetraalkylammonium hydroxide salt crystals 66. The water-soluble acidic polymer layer 77 can be the same as in the first embodiment.

Figure 13:
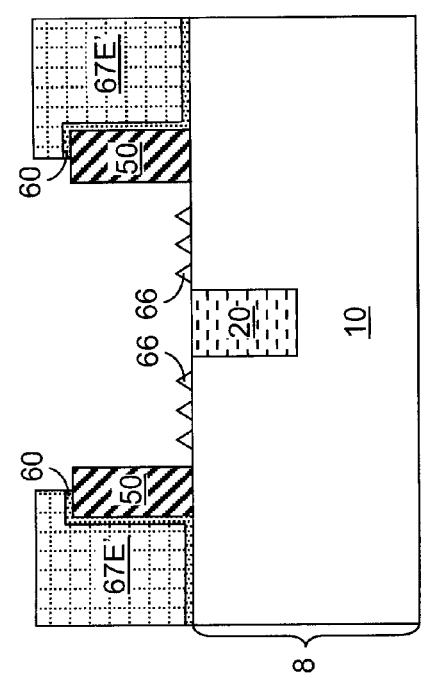
FIG. 13 is a vertical cross-sectional view of the second exemplary lithographic structure after the crystalline defects are dissolved in the water-soluble acidic polymer layer and after rinsing of the water-soluble acidic polymer layer according to the second embodiment of the present disclosure.

Referring to FIG. 13, the tetraalkylammonium hydroxide salt crystals 66 are dissolved in the water-soluble acidic polymer layer 77. The tetraalkylammonium hydroxide salt crystals 66, as an alkaline material, react with the water-soluble acidic polymer, which is an acidic material, and are dissolved within the water-soluble acidic polymer layer 77. The processing step may include a waiting step after application of the water-soluble acidic polymer layer 77 and a rinsing step to be subsequently performed as in the first embodiment. The time period for waiting and the temperature during the time period can be the same as in the first embodiment.

The water-soluble acidic polymer layer 77 is rinsed off with a solvent. The solvent can be the same as in the first embodiment. After rinsing off the water-soluble acidic polymer layer 77 with the solvent, the exposed surface of the substrate 8 is free of the tetraalkylammonium hydroxide salt crystals 66.

Ion implantation or any other semiconductor processing steps compatible with the presence of the exposed photoresist portion 67E' on the substrate 8 can be performed at this point. The processing steps of the second embodiment may be repeated multiple times as needed.

While the disclosure has been described in terms of specific embodiments, it is evident in view of the foregoing description that numerous alternatives, modifications and variations will be apparent to those skilled in the art. Accordingly, the disclosure is intended to encompass all such alternatives, modifications and variations which fall within the scope and spirit of the disclosure and the following claims.

What is claimed is:

1. A method of forming and removing alkaline particles during lithographic processing, said method comprising:
    forming an adhesion promoter layer directly on a surface of a substrate;
    forming a photoresist layer over said adhesion promoter layer, wherein said photoresist layer is insoluble to a developer solution including tetraalkylammonium hydroxide;
    exposing a portion of said photoresist layer to light or electron beam, wherein said exposing renders an exposed portion of said photoresist layer soluble to said developer solution including tetraalkylammonium hydroxide;
    removing said exposed portion of said photoresist layer with said developer solution including tetraalkylammonium hydroxide, wherein said removing of said exposed portion of the photoresist layer exposes a portion of said adhesion promoter layer;
    contacting said exposed portion of the adhesion promoter layer with said developer solution including tetraalkylammonium hydroxide, wherein said contacting of the exposed portion of the adhesion promoter layer with tetraalkylammonium hydroxide forms tetraalkylammonium hydroxide salt crystals on said surface of said substrate;
    applying a water-soluble acidic polymer layer on said surface of said substrate, wherein said water-soluble acidic polymer layer comprises a water soluble acidic polymer having an acidic group selected from the group consisting of maleic acid, phosphonic acid, phenolic acid, hexafluoroalcohol, sulfonic acid, and sulfinic acid, and wherein said tetraalkylammonium hydroxide salt crystals are dissolved in said water-soluble acidic polymer layer; and
    rinsing off said water-soluble acidic polymer layer with a solvent, wherein said surface of said substrate becomes free of said tetraalkylammonium hydroxide salt crystals.

2. The method of claim 1, wherein said tetraalkylammonium hydroxide is selected from tetramethylammonium hydroxide, tetraethylammonium hydroxide, tetrabutylammonium hydroxide, tetrahexylammonium hydroxide, tetraoctylammonium hydroxide, tetradecylammonium hydroxide, tetradodecylammonium hydroxide, and hexadecyltrimethyammonium hydroxide.

3. The method of claim 1, wherein said solvent is deionized water.

4. The method of claim 1, wherein said developer solution including tetraalkylammonium hydroxide further includes water.

5. The method of claim 1, wherein a weight percentage of said tetraalkylammonium hydroxide in said developer solution including tetraalkylammonium hydroxide is from 1% to 50% and water is a balance liquid in said developer solution.

6. The method of claim 1, further comprising waiting for a time period between said applying of said water-soluble acidic polymer layer and said rinsing off of said water-soluble acidic polymer layer.

7. The method of claim 6, wherein said time period is from 1 minute to 24 hours.

8. The method of claim 6, wherein said waiting is performed at a temperature selected from a range from 0 degree Celsius to 150 degree Celsius.

9. The method of claim 1, wherein said water-soluble acidic polymer is not sensitive to radiation in visible range and ultraviolet range.

10. The method of claim 9, wherein said water-soluble acidic polymer is soluble in alcohol.

11. The method of claim 1, wherein said water-soluble acidic polymer has a pH range from 2.0 to 6.0.

12. The method of claim 11, wherein said water-soluble acidic polymer has a pH range from 3.0 to 5.0.

13. The method of claim 1, wherein molecules of said water-soluble acidic polymer do not include a cross-linkable bond therein.

14. The method of claim 1, wherein said water-soluble acidic polymer has an extinction coefficient less than 0.002 within visible range and ultraviolet range.

15. The method of claim 1, wherein molecules of said water-soluble acidic polymer have molecular weights within a range from 1,000 to 20,000.

16. The method of claim 1, wherein said substrate includes a semiconductor material portion, and said surface is a semiconductor surface of said semiconductor material portion.

17. The method of claim 16, further comprising forming a patterned structure on said surface prior to said forming of said adhesion promoter layer, wherein said adhesion promoter layer is contiguously formed on surfaces of said patterned structure and said surface of said substrate.

18. The method of claim 1, wherein said adhesion promoter layer comprises an alkaline-moiety.

19. The method of claim 1, wherein said adhesion promoter layer comprises an organosilicon compound.

20. The method of claim 19, wherein said organosilicon compound is selected from the group consisting of triethylsilazane, tripropylsilazane, triphenylsilazane, N,N-diethyltriethylsilazane, hexaethyldisilazane, 1,1,3,3-tetramethyldisilizane, 1,1,3,3-tetraphenyl-1,3-dimethyldisilizane, 1,3,5,7-tetravinyl-1,3,5,7-tetramethylcyclotetrasilizane, 1,3,5-trivinyl-1,3,5-trimethylcyclotrisilizane, 1,3-bis(4-biphenyl)-1,1,3,3-tetramethyldisilizane, 1,3-bis(trifluoropropyl)-1,1,3,3-tetramethyldisilizane, 1,3-di-n-butyl-1,1,3,3-tetramethyldisilizane, 1,3-di-n-octyl-1,1,3,3-tetramethyldisilizane, 1,3-diphenyl-1,1,3,3-tetramethyldisilizane, 1,3-di-n-propyl-1,1,3,3-tetramethyldisilizane, 1,3-divinyl-1,3-diphenyl-1,3-dimethyldisilizane, 1,3-divinyl-1,1,3,3-tetramethyldisilizane, and hexamethyldisilazane.

21. The method of claim 1, wherein said adhesion promoter layer is formed by vapor printing.

* * * * *